(12) United States Patent
Shiratori et al.

(10) Patent No.: US 9,831,392 B2
(45) Date of Patent: Nov. 28, 2017

(54) COVER GLASS FOR LIGHT EMITTING DIODE PACKAGE, SEALED STRUCTURE, AND LIGHT EMITTING DEVICE

(71) Applicant: Asahi Glass Company, Limited, Chiyoda-ku (JP)

(72) Inventors: Makoto Shiratori, Haibara-gun (JP); Yoko Mitsui, Chiyoda-ku (JP); Satoshi Takeda, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 15/171,051

(22) Filed: Jun. 2, 2016

(65) Prior Publication Data

US 2016/0276544 A1 Sep. 22, 2016

Related U.S. Application Data

(63) Continuation of application No. PCT/JP2014/082305, filed on Dec. 5, 2014.

(30) Foreign Application Priority Data

Dec. 11, 2013 (JP) .................................. 2013-256170

(51) Int. Cl.
*H01L 33/48* (2010.01)
*C03C 3/091* (2006.01)
(Continued)

(52) U.S. Cl.
CPC ............ *H01L 33/483* (2013.01); *C03C 3/091* (2013.01); *C03C 3/093* (2013.01); *C03C 3/11* (2013.01);
(Continued)

(58) Field of Classification Search
CPC ....... H01L 33/48; H01L 33/483; H01L 33/50; H01L 33/502
See application file for complete search history.

(56) References Cited

U.S. PATENT DOCUMENTS

| 6,759,266 B1 * | 7/2004 | Hoffman ................. H01L 23/10 |
| | | 257/E23.193 |
| 2009/0009691 A1 | 1/2009 | Shiratori et al. |

(Continued)

FOREIGN PATENT DOCUMENTS

| JP | 2003-95692 | 4/2003 |
| JP | 2005-166733 | 6/2005 |

(Continued)

OTHER PUBLICATIONS

International Search Report dated Feb. 24, 2015 in PCT/JP2014/082305, filed Dec. 5, 2014.

*Primary Examiner* — Cuong Q Nguyen
(74) *Attorney, Agent, or Firm* — Oblon, McClelland, Maier & Neustadt, L.L.P.

(57) ABSTRACT

To provide a cover glass for light emitting diode package, which is capable of preventing deterioration in transmittance characteristics during use for a long period of time, and a light emitting device. The cover glass for light emitting diode package has a basic composition comprising, by mass % as calculated as oxides, from 55 to 80% of $SiO_2$, from 0.5 to 15% of $Al_2O_3$, from 5 to 25% of $B_2O_3$, from 0 to 7% of $Li_2O$, from 0 to 15% of $Na_2O$, from 0 to 10% of $K_2O$ (provided $Li_2O+Na_2O+K_2O$=from 2 to 20%), from 0 to 0.1% of $SnO_2$ and from 0.001 to 0.1% of $Fe_2O_3$, it does not substantially contain $As_2O_3$, $Sb_2O_3$ and PbO, and it has an average thermal expansion coefficient of from 45 to $70 \times 10^{-7}/°C$ in a temperature range of from 0 to 300° C.

14 Claims, 1 Drawing Sheet

(51) Int. Cl.
*C03C 3/093* (2006.01)
*C03C 3/11* (2006.01)
*C03C 8/24* (2006.01)
H01L 33/56 (2010.01)
H01L 33/32 (2010.01)
H01L 33/50 (2010.01)

(52) U.S. Cl.
CPC ............... *C03C 8/24* (2013.01); *H01L 33/32* (2013.01); *H01L 33/507* (2013.01); *H01L 33/56* (2013.01); *H01L 2924/16195* (2013.01); *H01L 2933/0033* (2013.01)

(56) References Cited

U.S. PATENT DOCUMENTS

2011/0025193 A1* 2/2011 Daicho ................. H01L 33/504
 313/503
2015/0270508 A1* 9/2015 Naito ...................... H01L 51/56
 257/40

FOREIGN PATENT DOCUMENTS

| JP | 2006-265068 | 10/2006 |
| JP | 2008-19134 | 1/2008 |
| WO | WO 2006/103942 A1 | 10/2006 |

* cited by examiner

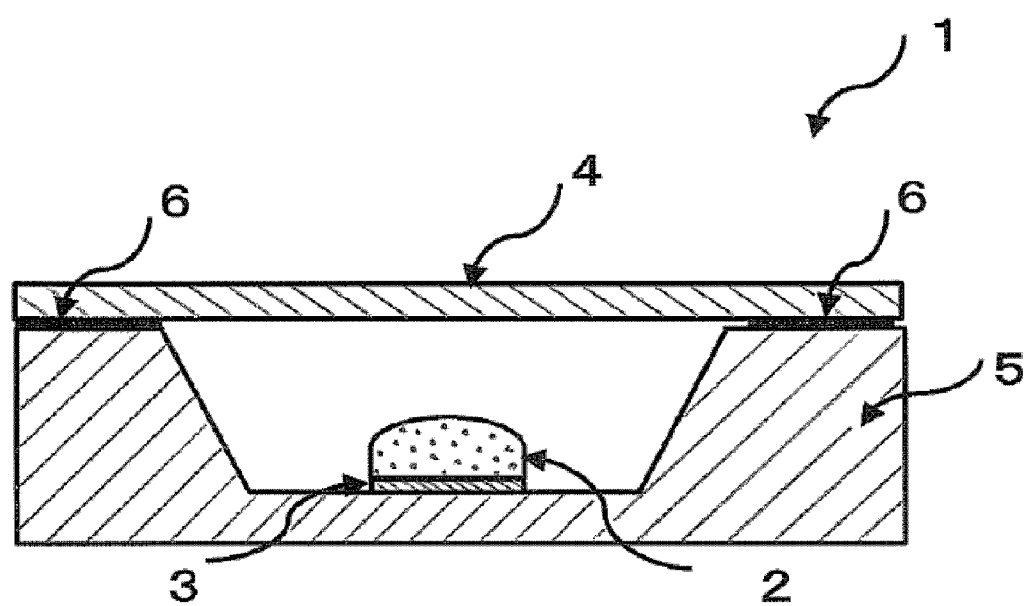

COVER GLASS FOR LIGHT EMITTING DIODE PACKAGE, SEALED STRUCTURE, AND LIGHT EMITTING DEVICE

TECHNICAL FIELD

The present invention relates to a light emitting device using a light emitting diode as a light source, a cover glass for light emitting diode package to be used for the device, and a sealed structure having the cover glass.

BACKGROUND ART

A light emitting device using a light emitting diode as a light emitting source is one to obtain light emission of a desired color by letting light be emitted from a light emitting diode chip and subjecting the emitted light to wavelength conversion by a phosphor.

For example, in order to obtain white light by a light emitting device, blue light is permitted to be generated by a light emitting diode chip of gallium nitride (GaN) type, and the blue light is permitted to pass through a wavelength conversion layer that holds a phosphor of yttrium•aluminum•garnet (YAG) type. Thus, light from red to green obtained as fluorescence is combined with blue color passed through the phosphor, whereby it is possible to obtain emission of white light.

The above wavelength conversion layer is such that one obtained by dispersing various phosphors to e.g. a resin component, is placed on the light emitting diode chip. Therefore, due to the heat radiation from the light emitting diode chip itself and the oxygen component in the atmosphere, deterioration of the wavelength conversion performance by long-term use is worried.

Whereas, a construction has been proposed wherein a plate-form protection member is provided which has a light transmittance with respect to light emitted from a light emitting diode chip and which is air-tightly secured to a package body in such a form to close a housing recess on one surface side of a semiconductor substrate (see Patent Document 1). According to this construction, it is possible to protect a light emitting diode chip housed inside, from mechanical destruction factors or environmental destruction factors from outside, without using a conventional sealing resin, and thus, it is possible to improve the reliability.

PRIOR ART DOCUMENT

Patent Document

Patent Document 1: JP-A-2005-166733

DISCLOSURE OF INVENTION

Technical Problem

In the light emitting diode package as disclosed in the above mentioned prior art document, a package body made of a silicon substrate and a protective member made of a glass substrate are said to be fixed by anodic bonding or surface activated bonding. However, if the substrate material of the package body is different from silicon, it is not possible to sufficiently prevent lowering of airtightness caused by the difference in thermal expansion coefficient between the package body and the protective member.

The present invention is to solve the above problem and has an object to provide a cover glass for light emitting diode package, capable of preventing deterioration of the transmittance characteristics during use for a long period of time, a sealed structure having the cover glass and the light emitting diode package bonded to each other, and a light emitting device.

Solution to Problem

In order to accomplish the above object, the cover glass for light emitting diode package according to the present invention is characterized in that it has a basic composition comprising, by mass % as calculated as oxides, from 55 to 80% of $SiO_2$, from 0.5 to 15% of $Al_2O_3$, from 5 to 25% of $B_2O_3$, from 0 to 7% of $Li_2O$, from 0 to 15% of $Na_2O$, from 0 to 10% of $K_2O$ (provided $Li_2O+Na_2O+K_2O=$from 2 to 20%), from 0 to 0.1% of $SnO_2$ and from 0.001 to 0.1% of $Fe_2O_3$, it does not substantially contain $As_2O_3$, $Sb_2O_3$ and PbO, and it has an average thermal expansion coefficient of from 45 to $70\times10^{-7}/°$ C. in a temperature range of from 0 to 300° C.

Further, the cover glass for light emitting diode package according to the present invention is characterized in that it has a basic composition comprising, by mass % as calculated as oxides, from 55 to 80% of $SiO_2$, from 0.5 to 15% of $Al_2O_3$, from 5 to 25% of $B_2O_3$, from 0 to 7% of $Li_2O$, from 0 to 15% of $Na_2O$, from 0 to 10% of $K_2O$ (provided $Li_2O+Na_2O+K_2O=$from 2 to 20%), from 0 to 0.1% of $SnO_2$ and from 0.003 to 0.1% of $Fe_2O_3$, it does not substantially contain $As_2O_3$, $Sb_2O_3$ and PbO, and it has an average thermal expansion coefficient of from 45 to $70\times10^{-7}/°$ C. in a temperature range of from 0 to 300° C.

Further, the sealed structure having a cover glass and a light emitting diode package bonded to each other, according to the present invention, is characterized in that the above cover glass and a light emitting diode package are bonded.

Further, the light emitting device according to the present invention is characterized by comprising the above cover glass for light emitting diode package, the above light emitting diode package having a light emitting diode mounted thereon, and a sealing material containing a low melting point glass which is melted by laser irradiation to bond the cover glass for light emitting diode package and the light emitting diode package.

The expression "to" indicating a numerical range in this specification, is used in the sense to include the numerical values described before and after the expression as the minimum value and the maximum value, and unless otherwise specified, hereinafter in this specification, "to" is used to have the same meaning.

Advantageous Effects of Invention

According to the present invention, it is less likely that hermetic sealing of the light emitting diode package having a light emitting diode mounted thereon and the cover glass for light emitting diode package is broken by e.g. a temperature change, and therefore, it is possible to prevent deterioration of the transmittance characteristics during use for a long period of time.

BRIEF DESCRIPTION OF DRAWING

FIG. 1 is a schematic sectional view of a cover glass for light emitting diode package and a light-emitting device according to an embodiment of the present invention.

DESCRIPTION OF EMBODIMENTS

One embodiment of the cover glass for light emitting diode package and the light emitting device of the present invention will be described with reference to the drawing.

A light emitting device 1 of this embodiment as shown in FIG. 1, comprises a light emitting diode chip (hereinafter referred to also as a light emitting diode) 3, a light emitting diode package 5 (hereinafter referred to also as a package 5) having the light emitting diode chip 3 mounted thereon, a wavelength conversion member 2 disposed on the light emitting diode chip 3, a cover glass 4 for light emitting diode package (hereinafter referred to as a cover glass 4), that is hermetically sealed to cover the opening of the package 5, and a sealing material 6 for bonding the package 5 and the cover glass 4. The light emitting device 1 of this embodiment is one to be used for e.g. a light source for various luminaires, or an operation display unit for electronics.

The package 5 is provided with a recess, and the light emitting diode chip 3 is mounted on the bottom surface of the recess. Further, wiring (not shown) to connect the light emitting diode chip 3 and an electrode portion (not shown) provided outside of the package 5, is provided inside the package 5.

As the package 5, one made of a glass ceramic substrate obtained by firing a glass ceramic composition containing a glass powder and a ceramic filler (low-temperature co-fired ceramic substrate; hereinafter sometimes referred to as LTCC), may be mentioned as a typical example and is preferably used. Further, a light reflecting layer such as silver which reflects light from e.g. the light emitting diode chip may be provided on the inner surface of the recess of the package 5. In consideration of the long-term reliability, such a light reflecting layer may be constructed so that a conductive layer made of silver is covered with an overcoat glass made of glass.

As the material for the package 5, as an example other than the above-mentioned glass ceramic substrate, alumina, silicon nitride, aluminum nitride, silicon carbide, etc. may be mentioned.

LTCC contains a glass powder and a ceramic filler, has a larger difference between the refractive index of the glass and the refractive index of the ceramic filler, and can increase the amount of the ceramic filler dispersed in the LTCC. Thus, the area of the interface which reflects light becomes large, and further, the thickness of the glass or the ceramic filler at both sides of the interface can be made larger than the wavelength of light, whereby the reflectance is high. Therefore, the package made of LTCC can efficiently reflect light from the light emitting element, and as a result, heat generation can be reduced.

Further, since it is formed from an inorganic oxide such as glass powder or ceramic filler, LTCC is free from degradation due to a light source unlike a resin substrate, and it is possible to maintain the color tone stability over a long period of time.

Usually, LTCC can be formed in the following manner. That is, firstly, a raw material powder composed mainly of a glass powder and a ceramic filler (ceramic powder) is mixed with a resin such as polyvinyl butyral or an acrylic resin, if necessary, by adding e.g. a plasticizer such as dibutyl phthalate, dioctyl phthalate or butyl benzyl phthalate. Then, a solvent such as toluene, xylene or butanol, is added to prepare a slurry, and this slurry is molded into a sheet by a doctor blade method or the like on a film of e.g. polyethylene terephthalate. Finally, the one thus having molded into a sheet is dried to remove the solvent to obtain a green sheet. In such a green sheet, as the case requires, a wiring pattern, a via-hole being a through-conductor, etc. may be formed by e.g. screen printing using a silver paste, a silver conductor or the like. In some cases, it is also possible to form an overcoat glass by e.g. screen printing to protect wirings, etc. formed of silver.

The above green sheet is fired and then processed into a desired shape to obtain a glass ceramic substrate. In this case, the body to be fired is a single green sheet or a laminate having a plurality of same green sheets overlaid one on another.

Further, as LTCC, the green sheet may be provided with through-holes, and a powder of a silver conductor or copper conductor having a high heat conductivity is made into a paste and embedded into the through-holes, followed by firing at the same time as the powder of the silver conductor or copper conductor, whereby it is possible to efficiently produce a glass ceramic substrate with through conductors having excellent heat dissipation properties.

The ceramic filler as a component of the glass ceramic composition may, for example, be alumina, titania or zirconia. It is possible to increase the strength of the substrate by incorporating an alumina filler. In order to increase the strength of the substrate, it is preferred to incorporate an alumina filler in an amount of at least 30 mass % in the composition.

The glass powder as a component of the glass ceramic composition is usually prepared by pulverizing glass obtained by a melting method. The pulverization method is not limited so long as it does not impair the object of the present invention, and it may be dry milling or may be wet milling. In the case of wet milling, it is preferred to use water as the solvent. Here, for the pulverization, a pulverizer such as a roll mill, a ball mill or a jet mill may suitably be used. After the pulverization, the glass may be dried or classified, as the case requires.

The glass powder as a component of the glass ceramic composition preferably has a 50% particle diameter ($D_{50}$) of from 0.5 to 5 μm. Here, in this specification, $D_{50}$ is a value calculated as the 50% value in the cumulative percent by volume from the particle size distribution obtained by a laser diffraction particle size distribution measurement.

The glass composition of the above glass powder is preferably one which essentially comprises, as represented by oxides, $SiO_2$, $B_2O_3$, CaO and $Al_2O_3$. For example, as the chemical composition of the glass powder, preferred is one comprising, as represented by molar percentage as calculated as oxides, from 57 to 65% of $SiO_2$, from 13 to 18% of $B_2O_3$, from 9 to 23% of CaO, from 3 to 8% of $Al_2O_3$, from 0 to 6% of $K_2O$, from 0 to 6% of $Na_2O$, and from 0.5 to 6% of $K_2O+Na_2O$.

With respect to the proportions of the glass powder and the ceramic filler, preferred is one containing from 25 to 55 mass % of the glass powder and from 45 to 75 mass % of the ceramic filler.

In this case, the content of the ceramic filler is more preferably at least 50 mass %, particularly preferably at least 55 mass %. If the content of the ceramic filler exceeds 75 mass %, there is a possibility that it becomes difficult to obtain a dense sintered body by firing, or smoothness of the substrate surface tends to be impaired, and it is preferably at most 70 mass %.

The light emitting diode chip 3 is a GaN-type blue light emitting diode chip that emits blue light, and a conductive substrate made of e.g. a sapphire substrate or n-type SiC substrate is used as a substrate for crystal growth. On the main surface side of the substrate for crystal growth, a light emitting portion formed by a GaN-type compound semiconductor material and having a layered structure such as a double heterostructure, is grown by an epitaxial growth method (for example, MOVPE method); on the back surface of the substrate for crystal growth, a cathode electrode (n-electrode) as a cathode side electrode (not shown), is formed; and on the surface of the light emitting portion (the outermost surface on the main surface side of the conductive substrate 11), an anode electrode (p-electrode) as an anode-side electrode (not shown) is formed. In short, on the light emitting diode chip, an anode electrode is formed on one surface side, and a cathode electrode is formed on the other surface side.

The wavelength conversion member 2 is disposed as overlaid on the light emitting diode chip 3. The wavelength conversion member 2 is constituted by a molded product of a mixture obtained by mixing a transparent material such as a silicone resin and a particulate yellow phosphor to be excited by blue light emitted from the light emitting diode chip 3 to emit light of a broad yellow type. Therefore, in the light emitting device 1 of this embodiment, blue light emitted from the light emitting diode chip 3 and light emitted from the yellow phosphor, are radiated from the light exit surface of the wavelength conversion member 2, whereby white light can be obtained. Here, the transparent material to be used for the wavelength conversion member 2 is not limited to a silicone resin, and, for example, an acrylic resin, an epoxy resin or glass may be employed. Further, the phosphor to be used for the wavelength conversion member is not limited to the above-mentioned yellow phosphor, and, for example, it is possible to obtain white light also by mixing a red phosphor and a green phosphor. Otherwise, so as to obtain light of a specific wavelength other than white light, a suitable phosphor may be used.

As mentioned above, the wavelength conversion member 2 is made of a phosphor and a resin or glass to disperse the phosphor, and is strongly influenced by the heat generation of the light emitting diode chip 3. Therefore, in addition to the effect of the heating generation, the wavelength conversion member 2 is likely to be deteriorated by reacting with the atmospheric air, whereby the initial emission characteristics of the light emitting device may not be maintained for a long period of time.

Therefore, by hermetically sealing the opening of the package 5 by the cover glass 4, the contact between the wavelength conversion member 2 and the atmosphere, is blocked to thereby suppress the deterioration of the wavelength conversion member 2.

The cover glass 4 has an average thermal expansion coefficient of from 45 to $70 \times 10^{-7}/°$ C. in a temperature range of from 0 to 300° C. in order to maintain the bonded state with the package 5 for a long period of time. Thus, when a glass ceramic substrate is used as a substrate material for the above described package 5, the difference in thermal expansion coefficient from the cover glass 4 is small, whereby it is possible to prevent that the bonded state of both is destroyed by heat generation of the light emitting diode chip 3.

The average thermal expansion coefficient of the cover glass 4 in a temperature range of from 0 to 300° C., is preferably from 45 to $65 \times 10^{-7}/°$ C., more preferably from 48 to $62 \times 10^{-7}/°$ C.

Further, the package 5 and the cover glass 4 are preferably bonded via a sealing material 6 containing a low melting point glass which is melted by laser irradiation. By using such a bonding method, it is possible to bond them reliably and firmly.

The sealing material 6 is provided on the package 5 side surface of the cover glass 4, to seal the opening of the package 5. Sealing material forming the sealing material 6, is one obtained by adding an electromagnetic wave absorbing material (i.e. material that generates heat by absorbing electromagnetic waves such as laser light or infrared rays) to a sealing glass (i.e. glass frit) made of low melting point glass. Further, a filler such as a low-expansion filler may be added with a view to adjusting the thermal expansion coefficient of the sealing material 6 or improvement of the sealing strength, and further, other additives may be contained as the case requires. Here, an additive such as an electromagnetic wave absorbing material or a low-expansion filler, is one so-called an inorganic filler.

As the sealing glass (glass frit), for example, low melting point glass such as tin-phosphate glass, bismuth glass, vanadium glass, lead glass, zinc borate alkali glass, etc. may be used. Among these, it is preferred to use a sealing glass made of tin-phosphate glass or bismuth glass, in consideration of adhesion to the cover glass 4 and the package 5 and its reliability (e.g. adhesion reliability and hermetic sealing property), and further in consideration of e.g. the influence to the environment or the human body.

The tin-phosphate glass (glass frit) preferably has a composition comprising, by mol % calculated as the following oxides, from 55 to 68 mol % of SnO, from 0.5 to 5 mol % of $SnO_2$ and from 20 to 40 mol % of $P_2O_5$ (basically the total amount of these is made to be 100 mol %).

The bismuth glass (glass frit) preferably has a composition comprising, by mass % calculated as the following oxides, from 70 to 90 mass % of $Bi_2O_3$, from 1 to 20 mass % of ZnO, from 2 to 12 mass % of $B_2O_3$ and from 0 to 20 mass % of $Al_2O_3$ (basically the total amount of these is made to be 100 mass %).

The electromagnetic wave absorbing material may, for example, be at least one metal (including its alloy) selected from Fe, Cr, Mn, Co, Ni, Cu, In, Sn and Zn, as well as an oxide containing at least one metal selected from the above metals, or a transparent conductive oxide, such as ITO (Sn doped indium oxide), or a tin oxide containing a dopant (ATO (Sb doped tin oxide) or FTO (F doped tin oxide)). The particle diameter $D_{50}$ of the electromagnetic wave absorbing material is preferably from 0.1 to 30 μm. It may be a pigment other than these.

Here, the amount of the electromagnetic wave absorbing material is preferably made to be in the range of from 0.1 to 40 vol % to the sealing material. If the content of the electromagnetic wave absorbing material is less than 0.1 vol %, it may be impossible to sufficiently melt the sealing material. If the content of the electromagnetic wave absorbing material exceeds 40 vol %, heat generation is likely to occur locally in the vicinity of the interface with the package 5 or the cover glass 4, or fluidity at the time of melting of the sealing material is likely to be deteriorated, whereby adhesion to the package 5 or the cover glass 4 tends to be lowered.

Further, as the low-expansion filler which may be added, silica, alumina, zirconia, zirconium silicate, cordierite, a zirconium phosphate compound, soda lime glass and borosilicate glass may be mentioned. The low-expansion filler is one having a thermal expansion coefficient lower than the sealing glass. The content of the low-expansion filler is suitably adjusted so that the thermal expansion coefficient of the sealing glass powder will be close to that of the cover glass 4. The low-expansion filler is preferably contained in a range of from 0.1 to 50 vol % in the sealing material, although the content may depend also on the thermal expansion coefficient of the sealing glass powder or the cover glass 4.

Then, the sealing material as described above is mixed with a vehicle to prepare a sealing material paste (i.e. a sealant). The vehicle is one obtained by dissolving a resin as a binder component in a solvent. The resin for the vehicle may, for example, be a cellulose type resin, such as methyl cellulose, ethyl cellulose, carboxymethyl cellulose, oxyethyl cellulose, benzyl cellulose, propyl cellulose or nitrocellulose, or an organic resin such as an acrylic resin obtainable by polymerizing at least one acrylic monomer such as methyl methacrylate, ethyl methacrylate, butyl methacrylate, 2-hydroxyethyl methacrylate, butyl acrylate, 2-hydroxyethyl acrylate, etc. As the solvent, in the case of a cellulose type resin, a solvent such as terpineol, butyl carbitol acetate or ethyl carbitol acetate, and in the case of an acrylic resin, a solvent such as methyl ethyl ketone, terpineol, butyl carbitol acetate or ethyl carbitol acetate, is used.

The viscosity of the sealing material paste may be set to be suitable for the apparatus for application to the cover glass 4, and may be adjusted by the ratio of the resin (i.e. binder component) to the solvent, or the ratio of the sealing glass component to the vehicle. To the sealing material paste, known additives to a glass paste, such as an antifoaming agent, a dispersing agent, etc. may be added. In the preparation of the sealing material paste, it is possible to employ a known method using a rotary mixer equipped with a stirring blade, or a roll mill, a ball mill or the like.

The average thermal expansion coefficient of this sealing material in a temperature range of from 50 to 350° C. is preferably at most $90 \times 10^{-7}$/° C., more preferably at most $88 \times 10^{-7}$/° C., further preferably at most $85 \times 10^{-7}$/° C. Further, it is preferably at least $30 \times 10^{-7}$/° C. If it is lower than this, flowability of the sealing material tends to be so low that sealing may not be conducted by using a laser beam.

It is thereby possible to reduce the amount of thermal expansion of the sealing portion at the time of laser irradiation and to prevent cracking caused by residual stress.

As the cover glass 4, it is possible to use one which satisfies the above average thermal expansion coefficient and which has a basic composition comprising, by mass % as calculated as the following oxides, from 55 to 80% of $SiO_2$, from 0.5 to 15% of $Al_2O_3$, from 5 to 25% of $B_2O_3$, from 0 to 7% of $Li_2O$, from 0 to 15% of $Na_2O$, from 0 to 10% of $K_2O$ (provided $Li_2O+Na_2O+K_2O$=from 2 to 20%), less than 0.01% of $ZrO_2$, from 0 to 0.1% of $SnO_2$ and from 0.001 to 0.1% of $Fe_2O_3$, and has a glass composition containing substantially no $As_2O_3$, $Sb_2O_3$ and PbO.

Further, as the cover glass 4, it is possible to use one which satisfies the above average thermal expansion coefficient and which has a basic composition comprising, by mass % as calculated as the following oxides, from 55 to 80% of $SiO_2$, from 0.5 to 15% of $Al_2O_3$, from 5 to 25% of $B_2O_3$, from 0 to 7% of $Li_2O$, from 0 to 15% of $Na_2O$, from 0 to 10% of $K_2O$ (provided $Li_2O+Na_2O+K_2O$=from 2 to 20%), less than 0.01% of $ZrO_2$, from 0 to 0.1% of $SnO_2$ and from 0.003 to 0.1% of $Fe_2O_3$, and has a glass composition containing substantially no $As_2O_3$, $Sb_2O_3$ and PbO.

The reasons as to why the contents, etc. of the respective components constituting the cover glass 4 in this embodiment are defined as above will be described below. The contents of the respective components are all represented by mass %.

$SiO_2$ is a main component constituting the glass skeleton and is a component for improving the durability of the glass, but if it is less than 55%, the chemical durability cannot be obtained, and if it exceeds 80%, the melting property will be remarkably deteriorated. Preferably, it is from 58 to 75%.

$Al_2O_3$ is a component for improving the weather resistance of glass, but if it is less than 0.5%, the chemical durability tends to be insufficient, and if it exceeds 15%, striae tend to be formed in the glass. Preferably, it is from 1 to 15%.

$B_2O_3$ is a component employed for the purpose of improving the melting property and adjusting the viscosity, but if it exceeds 25%, the weather resistance tends to decrease, and if it is less than 5%, the melting property tends to be deteriorated. Preferably, it is from 10 to 22%.

$Li_2O$, $Na_2O$ and $K_2O$ will function as a flux and are components for improving the devitrification resistance. The contents of the respective components are preferably made to be, by mass %, from 0 to 7% of $Li_2O$, from 0 to 15% of $Na_2O$, and from 0 to 10% of $K_2O$. If the respective contents exceed the respective upper limits, the thermal expansion coefficient is likely to become too large, or the weather resistance is likely to be deteriorated. Here, the total content of $Li_2O$, $Na_2O$ and $K_2O$ ($Li_2O+Na_2O+K_2O$) shall be from 2 to 20%. If the total content of $Li_2O$, $Na_2O$ and $K_2O$ is less than 2%, the above effect will not be obtainable, and if it exceeds 20%, the weather resistance tends to be deteriorated, and the thermal expansion coefficient becomes large.

Alkaline earth metal oxides (MgO, CaO, SrO, BaO) are components effective for improving the melting property, weather resistance and devitrification resistance, or adjusting the thermal expansion coefficient, and may optionally be contained. For the purpose of lowering the refractive index of the glass, SrO and BaO are preferably not contained.

$Fe_2O_3$ is a component to prevent discoloration of glass by ultraviolet solarization. The iron component is a component that strongly absorbs ultraviolet radiation and thus is a component which can be expected to provide a ultraviolet shielding effect as is contained in a small amount in the glass, and it is an essential component in an embodiment of the present invention, but if $Fe_2O_3$ is less than 0.001% by mass %, its effect cannot be expected, and if it exceeds 0.1%, the glass tends to be colored, and the amount of transmitted light is likely to decrease. Preferably, it is within a range of from 0.003% to 0.07%, more preferably within a range of from 0.004% to 0.05%. The iron component is present in different valence states of ions such as $Fe^{2+}$ and $Fe^{3+}$ in the glass, and it causes coloration of the glass as the ionic valence is converted by ultraviolet irradiation. On the other hand, a portion colored by ultraviolet irradiation serves as a film for shielding ultraviolet rays thereby to prevent progression of the ultraviolet solarization by blocking the ultraviolet radiation from entering into the glass. Therefore, if the iron component content in the glass is small, holes formed by the action of ultraviolet rays penetrated inside the glass become light emission centers, and as a result, the transmittance properties of the glass will be deteriorated. Based on such coloration mechanism of glass due to ultraviolet rays, $Fe_2O_3$ is required to be contained within a predetermined range.

The iron component in glass is present in the form of $Fe_2O_3$ and FeO, and in the present invention, it is meant for a value obtained by calculating all of the iron component as $Fe_2O_3$. Incidentally, $Fe_2O_3$ is a component for improving the ultraviolet absorptivity, while FeO is a component for improving the heat ray absorptivity. In order to let glass have high transmittance, the proportion of FeO to the total iron oxide is preferably less than 40%. The balance of $Fe_2O_3$ and FeO can be controlled by adjusting the amounts of an oxidizing agent and a reducing agent to be added to the glass raw material, oxidation-reduction conditions in the glass melting furnace atmosphere, etc.

Further, in addition to the method of adding the iron component as a glass raw material, the iron component in glass may be added by using either a method of addition by a silica sand material by grasping the iron component contained in the silica sand material, or a method of addition during the production process by grasping the iron component to be mixed during the production process, i.e. by a method of addition by a means other than the raw material.

$SnO_2$ is a component for preventing ultraviolet solarization and may be contained, although it is not essential. In a case where $SnO_2$ is contained in an amount exceeding 0.1% as calculated as $SnO_2$, the ultraviolet absorbing performance of glass tends to be high, and the transmittance of near ultraviolet light tends to decrease, such being not desirable. The content of $SnO_2$ is preferably from 0.002 to 0.04%, more preferably from 0.002 to 0.015%. In the present invention, the Sn component is defined by the content of $SnO_2$, and this means that the content of Sn (tin) contained in the glass composition, is within the predetermined range as represented by a mass ratio, as calculated as stannic oxide being an oxide. Other components in the glass composition are likewise represented as calculated as their specified oxides.

$TiO_2$ is a component for preventing ultraviolet solarization, and may be contained although it is not essential. If $TiO_2$ is contained in an amount exceeding 2% as calculated as $TiO_2$, the ultraviolet absorbing performance of glass tends to be high and the transmittance of near ultraviolet light tends to decrease, and at the same time, the refractive index tends to increase, such being undesirable. The content of $TiO_2$ is preferably from 0.003 to 1.5%, more preferably from 0.005 to 1%.

Further, the cover glass 4 is required to be made so that quality defects such as bubbles, foreign matters, etc. be as little as possible and as small as possible (for example, at most 5 µm). The cover glass of the present invention does not substantially contain $As_2O_3$, $Sb_2O_3$ and PbO which were used as clarifying agents in conventional glass, as they are environmental load substances. Therefore, for the purpose of clarification, it is preferred to suitably add a sulfate, a nitrate, a chloride and/or a fluoride singly or in combination.

Each of such sulfate, nitrate, chloride and fluoride components is a decomposable volatile component and will be volatilized as an exhaust gas, and in considering of corrosion of the exhaust gas treating device, and the cost for the treatment in the glass production, the upper limit is preferably set to be at most 0.5%. Further, in order to effectively diminish the foam, the content is preferably set to be at least 0.005%. Such a content is as calculated as an oxide in the case of a sulfate or a nitrate, and as calculated as an element (Cl, F) in the case of a chloride or a fluoride.

The cover glass 4 is preferably adjusted so that the transmittance at a wavelength of 365 nm in a thickness of 1 mm is at least 85%. By doing so, it is possible to provide a light emitting device suitable as a near ultraviolet light source.

The cover glass 4 is preferably adjusted so that the average transmittance at a wavelength of from 808 to 1,064 nm in a thickness of 1 mm is at least 85%. By doing so, when the package 5 and the cover glass 4 are to be bonded by using a sealing material 6, the laser beam to be used for melting the sealing material 6 will not be shielded by the cover glass 4, and it is possible to quickly melt the sealing material 6.

The cover glass 4 is preferably adjusted so that the refractive index (nd) is at most 1.52. By doing so, the reflection loss at the surface is suppressed, and the transmittance becomes high. The refractive index (nd) is more preferably at most 1.50, more preferably at most 1.49. Here, the refractive index is the refractive index of the d-line (590 nm).

Now, a method for producing the cover glass for light-emitting diode package of the present invention will be described.

Firstly, glass raw materials constituting the respective components having desired compositions are prepared. Glass raw materials to be utilized in the present invention, may be compounds in any form, including oxides, hydroxides, carbonates, sulfates, nitrates, fluorides, chlorides, etc.

Then, such raw materials are formulated into a glass raw material so that glass having a desired composition will be obtainable, and the raw material is put into a melting tank.

The melting tank is a container selected from platinum, a platinum alloy and refractory. Here, the container selected from a platinum alloy, is meant for a container made a platinum alloy selected from the group consisting of alloys composed of platinum (Pt), and one or a plurality of iridium (Ir), palladium (Pd), rhodium (Rh) and gold (Au), and is one durable for high temperature melting.

Glass melted in the melting tank is then subjected to removal of bubbles and striae in a degassing vessel and a stirring tank arranged on downstream side, whereby it is possible to obtain a homogenized high quality glass which has little glass defect. The obtained glass is molded into a predetermined shape by letting it flow out via e.g. a nozzle, followed by cast molding in a mold, or by pulling it out in the form of a rolled-out plate-shape. The annealed glass is subjected to slicing, polishing or the like, to obtain glass having a predetermined shape.

The cover glass for light emitting diode package of the present invention is useful for a light emitting device comprising a package having a light emitting diode mounted thereon (a glass ceramic substrate in the above described example), a cover glass for light emitting diode package, and a sealing material containing a low melting point glass which is melted by laser irradiation to bond the cover glass for light emitting diode package and the above package (the glass ceramic substrate).

In such a construction, glass components are contained in all of the cover glass for light emitting diode package, the glass ceramic substrate as a light emitting diode package, and the sealing material constituting the light emitting device, and therefore, they can be bonded well without leading to a poor reactivity as seen at the time of bonding between different types of materials. Further, by adjusting the difference in the average thermal expansion coefficient in a temperature range of from 25 to 300° C. between the glass ceramic substrate and the cover glass for light emitting diode package, to be at most $20 \times 10^{-7}/°$ C., preferably at most $15 \times 10^{-7}/°$ C., it is possible to provide sufficient durability against a thermal shock during use of the light-emitting device, and it is possible to maintain a high hermetic sealing property over a long period of time.

Further, by making "the average thermal expansion coefficient of the glass ceramic substrate"≥"the average thermal expansion coefficient of the cover glass for light emitting diode package", it is possible to increase the substrate strength against a thermal stress at the time of laser sealing of the cover glass for light emitting diode package, and therefore, cracking of the inorganic material substrate can be prevented, such being preferred. The above relational expression means that in a temperature range of from 25 to 300° C., the average thermal expansion coefficient of the glass ceramic substrate is at least the average thermal expansion coefficient of the cover glass for light emitting diode package.

Further, by satisfying the above relational expression, it is possible to broaden the output width (output margin) of laser light at the time of laser sealing of the cover glass for light emitting diode package. The output of laser light is varied by e.g. deterioration of the laser irradiation apparatus. The adhesion of the sealing material depends on the output of laser light, and as the output width of laser light whereby good adhesion can be obtained becomes broad, stable production becomes possible with less failure in adhesion.

Now, the present invention will be described with reference to Examples.

The sample used in each Example (each of Ex. 1 to Ex. 15 and Ex. 20 in Table 1 and Table 2) or each Comparative Example (each of Ex. 16 and Ex. 17 in Table 2) was prepared in the following manner.

Firstly, a glass raw material was formulated so as to have a glass composition shown in Table 1 or Table 2, and using a platinum crucible, this glass raw material formulation was subjected to melting at a temperature of 1,550° C. for 5 hours in an electric furnace with a molybdenum silicide as a heating element, followed by clarification and stirring. This glass was cast and molded in a casting mold, followed by annealing to obtain 800 g of a glass sample (glass block). Further, this glass block was subjected to slicing and polishing to obtain a plate-form cover glass for light emitting diode package, having a predetermined shape (25 mm (vertical dimension)×25 mm (horizontal dimension)×1 mm (thickness)).

With respect to the obtained glass, the average thermal expansion coefficient in a temperature range of from 0 to 300° C., the average thermal expansion coefficient in a temperature range of from 25 to 300° C., the transmittance at a wavelength of 365 nm in a thickness of 1 mm (before ultraviolet light irradiation and after irradiation with ultraviolet light for 300 hours), the average transmittance at a wavelength of from 808 to 1,064 nm in a thickness of 1 mm, and the refractive index (nd), were measured. These results are shown in Table 1 and Table 2. Here, in the evaluation results in Table 1 and Table 2, the symbol "-" means "not measured".

TABLE 1

|  | Ex. 1 | Ex. 2 | Ex. 3 | Ex. 4 | Ex. 5 | Ex. 6 | Ex. 7 | Ex. 8 | Ex. 9 |
| --- | --- | --- | --- | --- | --- | --- | --- | --- | --- |
| $SiO_2$ | 69.2 | 72.3 | 68.5 | 72.8 | 77.6 | 74.2 | 78.2 | 74.2 | 68.7 |
| $Al_2O_3$ | 2.8 | 2.5 | 3.2 | 3.6 | 2.1 | 2.5 | 2.5 | 2.5 | 3.3 |
| $Fe_2O_3$ | 0.005 | 0.007 | 0.017 | 0.007 | 0.007 | 0.010 | 0.024 | 0.032 | 0.043 |
| $Li_2O$ | 0.8 | 0.0 | 0.7 | 0.5 | 0.0 | 0.0 | 0.0 | 0.0 | 0.0 |
| $Na_2O$ | 0.4 | 7.4 | 0.4 | 6.0 | 6.7 | 7.4 | 7.4 | 7.4 | 7.4 |
| $K_2O$ | 8.1 | 1.0 | 8.3 | 1.5 | 0.0 | 1.0 | 1.0 | 1.0 | 1.0 |
| $B_2O_3$ | 18.6 | 15.9 | 18.5 | 15.5 | 5.5 | 14.0 | 10.0 | 10.0 | 17.0 |
| MgO | 0.0 | 0.0 | 0.1 | 0.0 | 0.8 | 0.0 | 0.0 | 3.9 | 0.5 |
| CaO | 0.0 | 0.0 | 0.1 | 0.0 | 7.2 | 0.0 | 0.0 | 0.0 | 1.6 |
| BaO | 0.0 | 0.0 | 0.0 | 0.0 | 0.0 | 0.0 | 0.0 | 0.0 | 0.0 |
| SrO | 0.0 | 0.0 | 0.0 | 0.0 | 0.0 | 0.0 | 0.0 | 0.0 | 0.0 |
| $TiO_2$ | 0.0003 | 0.005 | 0.040 | 0.010 | 0.007 | 0.005 | 0.005 | 0.020 | 0.400 |
| ZnO | 0.0 | 0.8 | 0.0 | 0.0 | 0.0 | 0.8 | 0.8 | 0.8 | 0.0 |
| Cl | 0.0 | 0.1 | 0.1 | 0.1 | 0.1 | 0.1 | 0.1 | 0.1 | 0.1 |
| SnO | 0.02 | 0.0 | 0.0 | 0.0 | 0.0 | 0.0 | 0.0 | 0.0 | 0.0 |
| $SO_3$ | 0.004 | 0.0 | 0.0 | 0.0 | 0.0 | 0.0 | 0.0 | 0.0 | 0.0 |
| $Sb_2O_3$ | 0.0 | 0.0 | 0.0 | 0.0 | 0.0 | 0.0 | 0.0 | 0.0 | 0.0 |
| Total | 100.0 | 100.0 | 100.0 | 100.0 | 100.0 | 100.0 | 100.0 | 100.0 | 100.0 |
| Average thermal expansion coefficient (0° C. to 300° C.) [×$10^{-7}$/° C.] | 51 | 50 | 51 | 49 | 54 | 48 | 49 | 52 | 52 |
| Average thermal expansion coefficient (25° C. to 300° C.) [×$10^{-7}$/° C.] | 44 | — | — | — | — | — | — | — | — |
| Transmittance 365 nm (t1 mm) [%] before ultraviolet irradiation | 92.1 | 90.9 | 91.6 | 91.0 | 89.9 | 90.9 | 91.0 | 89.8 | 90.7 |
| Transmittance 365 nm (t1 mm) [%] after ultraviolet irradiation | 73.1 | 89.5 | 89.9 | 89.2 | 84.8 | 90.2 | 86.6 | 86.2 | 89.4 |
| Average transmittance 808 to 1,064 nm (t1 mm) [%] | 92.8 | 92.4 | 92.7 | 92.4 | 91.4 | 92.3 | 92.1 | 91.5 | 91.5 |
| Refractive index (nd) | 1.488 | 1.487 | 1.481 | — | — | — | — | — | — |

TABLE 2

|  | Ex. 10 | Ex. 11 | Ex. 12 | Ex. 13 | Ex. 14 | Ex. 15 | Ex. 16 | Ex. 17 | Ex. 20 |
| --- | --- | --- | --- | --- | --- | --- | --- | --- | --- |
| $SiO_2$ | 67.2 | 63.0 | 61.0 | 67.0 | 66.3 | 62.2 | 64.2 | 59.7 | 62.0 |
| $Al_2O_3$ | 3.3 | 3.3 | 3.3 | 3.3 | 2.8 | 7.5 | 4.2 | 17.4 | 7.6 |
| $Fe_2O_3$ | 0.007 | 0.007 | 0.007 | 0.007 | 0.010 | 0.008 | 0.0 | 0.0 | 0.002 |
| $Li_2O$ | 0.0 | 0.0 | 0.0 | 0.0 | 0.0 | 0.0 | 0.0 | 0.0 | 0.0 |
| $Na_2O$ | 7.4 | 7.4 | 7.4 | 7.4 | 10.0 | 10.0 | 6.4 | 0.0 | 9.95 |
| $K_2O$ | 1.0 | 1.0 | 1.0 | 1.0 | 0.0 | 0.0 | 0.1 | 6.5 | 0.0 |
| $B_2O_3$ | 17.0 | 17.0 | 17.0 | 15.0 | 18.6 | 18.1 | 8.4 | 8.0 | 18.5 |
| MgO | 1.0 | 2.5 | 3.2 | 1.5 | 1.9 | 1.9 | 0.0 | 3.2 | 1.8 |
| CaO | 3.0 | 5.7 | 7.0 | 4.7 | 0.1 | 0.1 | 0.0 | 4.0 | 0.0 |
| BaO | 0.0 | 0.0 | 0.0 | 0.0 | 0.1 | 0.0 | 0.0 | 0.0 | 0.0 |

TABLE 2-continued

|  | Ex. 10 | Ex. 11 | Ex. 12 | Ex. 13 | Ex. 14 | Ex. 15 | Ex. 16 | Ex. 17 | Ex. 20 |
|---|---|---|---|---|---|---|---|---|---|
| SrO | 0.0 | 0.0 | 0.0 | 0.0 | 0.0 | 0.0 | 0.0 | 7.6 | 0.0 |
| $TiO_2$ | 0.010 | 0.015 | 0.005 | 0.008 | 0.100 | 0.008 | 4.3 | 0.0 | 0.0005 |
| ZnO | 0.0 | 0.0 | 0.0 | 0.0 | 0.0 | 0.0 | 5.9 | 0.0 | 0.0 |
| Cl | 0.1 | 0.1 | 0.1 | 0.1 | 0.1 | 0.1 | 0.0 | 0.0 | 0.06 |
| SnO | 0.0 | 0.0 | 0.0 | 0.0 | 0.02 | 0.02 | 0.0 | 0.0 | 0.02 |
| $SO_3$ | 0.0 | 0.0 | 0.0 | 0.0 | 0.02 | 0.01 | 0.0 | 0.1 | 0.02 |
| $Sb_2O_3$ | 0.0 | 0.0 | 0.0 | 0.0 | 0.0 | 0.0 | 0.1 | 0.0 | 0.0 |
| Total | 100.0 | 100.0 | 100.0 | 100.0 | 100.0 | 100.0 | 100.0 | 100.0 | 100.0 |
| Average thermal expansion coefficient (0° C. to 300° C.) [×$10^{-7}$/° C.] | 53 | 59 | 62 | 58 | 60 | 62 | 73 | 38 | 62 |
| Average thermal expansion coefficient (25° C. to 300° C.) [×$10^{-7}$/° C.] | — | — | — | — | 61 | 63 | 72 | 38 | — |
| Transmittance 365 nm (t1 mm) [%] before ultraviolet irradiation | 90.5 | 90.3 | 91.1 | 90.8 | — | — | — | — | — |
| Transmittance 365 nm (t1 mm) [%] after ultraviolet irradiation | 89.4 | 89.7 | 89.8 | 90.0 | — | — | — | — | — |
| Average transmittance 808 to 1,064 nm (t1 mm) [%] | 91.0 | 90.8 | 91.9 | 91.3 | 91.1 | 92.2 | — | — | — |
| Refractive index (nd) | — | — | — | — | — | — | 1.520 | — | — |

The average thermal expansion coefficient in a temperature range from 0 to 300° C. was calculated by measuring the elongation of glass with a dial gauge, by putting in thermostatic baths at 0° C. and 300° C., samples processed into a cylindrical shape with a diameter of 6 mm and a length of 100 mm.

Further, the average thermal expansion coefficient in a temperature range of from 25 to 300° C. was likewise calculated by measuring the elongation of glass with a dial gauge, by putting in thermostatic baths at 25° C. and 300° C., samples processed into a cylindrical shape with a diameter of 6 mm and a length of 100 mm.

For the transmittance, with respect to glass having a predetermined shape (25 mm (vertical dimension)×25 mm (horizontal dimension)×1 mm (thickness)) which had both surfaces optically polished to have a thickness of 1 mm, the transmittance (wavelength of 365 nm, wavelength of from 808 to 1,064 nm) was measured by V-570 type ultraviolet visible near infrared spectrophotometer (manufactured by JASCO Corporation). Then, in accordance with the Japan Optical Glass Industry Association Measuring Standard JOGIS-04, the glass was irradiated with ultraviolet light for 300 hours, and thereafter, the transmittance (wavelength 365 nm) of the glass was measured again, whereupon the transmittance change before and after the ultraviolet irradiation was compared.

As shown in Table 1 and Table 2, the respective glasses in Examples have average thermal expansion coefficients within a range of from 48 to 62×$10^{-7}$/° C., whereby when each glass is bonded by a sealing material to a light emitting diode package made of a glass ceramic substrate, because the degrees of deformation in the plane direction of the respective members due to thermal shock are similar, it is possible to maintain the hermetic seal of inside of the package wherein a light emitting diode chip is mounted, over a long period of time.

Further, with the respective glasses in Examples, the change in transmittance at a wavelength of 365 nm before and after the ultraviolet irradiation is small, whereby the initial emission characteristics of the light emitting device can be maintained for a long period of time.

Further, with the respective glasses in Examples, the refractive index (nd) is at most 1.52, whereby the reflectance at the front and back surfaces can be suppressed to be low in the measurement of the transmittance, and it is possible to obtain a high transmittance.

Whereas, with the respective glasses in Comparative Examples, the average thermal expansion coefficient is outside the range of the present invention, and it is concerned that such a defect may occur that the output margin of laser light is narrow at the time of sealing a sealing material containing low melting point glass, by the laser, or such a problem may occur that cracking or peeling results when the sealed structure is subjected to a temperature cycle test.

Then, with respect to a light emitting device using the cover glass of the present invention, the laser output and adhesion were examined at the time of bonding the cover glass and a light emitting diode package made of a glass ceramic substrate composed of LTCC, as the package, by a sealing material containing low melting point glass.

As the sealing material, the following material was used.

As sealing glass, bismuth-type glass (softening point: 410° C.) having a composition comprising, by mass % of the following oxides, 83% of $Bi_2O_3$, 5% of $B_2O_3$, 11% of ZnO and 1% of $Al_2O_3$ and having $D_{50}$ of 1.0 μm; as a low-expansion filler, a cordierite powder having $D_{50}$ of 4.3 μm; and as an electromagnetic wave absorber, an ATO powder having $D_{50}$ of 1.0 μm; were prepared.

$D_{50}$ of the cordierite powder and ATO powder was measured by using a particle size analyzer (Microtrac HRA, manufactured by Nikkiso Co., Ltd.). Measurement conditions were such that measurement mode: HRA-FRA mode, Particle Transparency: yes, Spherical Particles: no, Particle Refractive index: 1.75, and Fluid Refractive index: 1.33. Each powder was dispersed in water and hexametaphosphate to obtain a slurry, which was then ultrasonically dispersed, followed by the measurement.

Then, 60.7 vol % of the sealing glass, 26.1 vol % of the cordierite powder and 13.2 vol % of the ATO powder were mixed to prepare a sealing material (average thermal expansion coefficient in a temperature range of from 50 to 350° C.: 62×$10^{-7}$/° C.). Then, 83 mass % of the sealing material and 17 mass % of a vehicle were mixed, and the mixture was passed 7 times through a three-roll mill to sufficiently disperse the cordierite powder and the ATO powder in the paste, to prepare a sealing material paste. As the vehicle, a mixture comprising 5 mass % of ethyl cellulose as an organic binder, and 95 mass % of 2,2,4-trimethyl-1,3-pentanediol mono-isobutyrate as a solvent, was used.

Ex. 18

The sealing material was applied by screen printing on a cover glass (average thermal expansion coefficient in a temperature range of from 0 to 300° C.: $52\times10^{-7}$/° C.) obtained by processing the glass of the above Ex. 1 to a size of 23 mm (vertical dimension)×23 mm (lateral dimension)×0.5 mm (thickness), followed by drying and firing to prepare a sealing material layer-attached cover glass having a sealing material layer formed on the surface.

Here, in the screen printing, a screen plate having a mesh size of 200 and an emulsion thickness of 10 μm, was used. Here, the pattern of the screen plate was a circular pattern having a line width of 0.5 mm and a radius of 20 mm. Further, the coating layer of the sealing material was dried under conditions of 120° C. for 10 minutes and then fired under conditions of 480° C. for 10 minutes to form a sealing material layer having a film thickness of 15 μm and a line width of 0.5 mm on the surface of the cover glass of Ex. 1.

Then, the above cover glass and a light emitting diode package made of a glass ceramic substrate composed of LTCC (average thermal expansion coefficient in a temperature range of from 25 to 300° C.: $60\times10^7$/° C., size: 23 mm (vertical dimension)×23 mm (lateral dimension)×1 mm (thickness)) having no sealing material layer formed on the surface, were laminated, and the sealing material layer was irradiated with laser light through the above cover glass, to melt the sealing material, followed by quenching and solidification to seal the cover glass and the light emitting diode package.

As the laser light, a semiconductor laser was used, and the laser light was applied with a spot diameter of 1.6 mm at a scanning speed of 4 mm/sec, while changing the output within a range of from 15 to 35 W. The intensity distribution of the laser light was not shaped to be constant, and a laser beam having a protrusion-like intensity distribution was used. As the spot diameter at that time, the radius of the contour line where the laser intensity became $1/e^2$ was used.

Further, for the output range of laser light useful for sealing, the sealed portion was examined, and the output range and the output width (output margin) were calculated where adhesion of the sealed portion to the substrate was good, and neither cracking of the cover glass nor peeling of the sealed portion was observed. The results are shown in Table 3.

Ex. 19

The sealing material prepared by using the same sealing material as in Ex. 18, was applied by screen printing on a substrate (average thermal expansion coefficient in a temperature range of from 0 to 300° C.: $38\times10^{-7}$/° C.) obtained by processing the glass in Ex. 17 to a size of 23 mm (vertical dimension)×23 mm (lateral dimension)×0.5 mm (thickness). Then, in the same manner as in Ex. 18, the sealing material was melted by irradiation with laser light, followed by quenching and solidification to seal the cover glass and the light emitting diode package. Then, the output range of laser light wherein the glass in Ex. 17 and the light emitting diode package made of LTCC can be sealed, was examined, and the margin of the laser output was calculated. The results are shown in Table 3.

The sealed structure in each of Ex. 18 and Ex. 19 (hereinafter one having a cover glass for light-emitting diode package and a light emitting diode package (typically a glass ceramic substrate) bonded to each other, will be referred to as a sealed structure having a cover glass and a light emitting diode package bonded), was subjected to a temperature cycle test (1 cycle: from −40 to 150° C., 200 cycles). Before and after the temperature cycle test, the presence or absence of cracking and peeling occurred at the sealed portion between the glass and the light-emitting diode package made of LTCC, was observed. These results are summarized in Table 3. Ex. 18 is an Example of the present invention, and Ex. 19 is a Comparative Example.

TABLE 3

| | | Ex. 18 | Ex. 19 |
|---|---|---|---|
| | Cover glass | Glass in Ex. 1 | Glass in Ex. 17 |
| Evaluation of sealing property | Output range [W] of laser light capable of sealing | 20 to 24 | 22 |
| | output margin [W] of laser light | 5 | 1 |
| | Presence or absence of cracking and peeling after temperature cycle test | Absent | Present |

As shown in Table 3, in Ex. 18, no cracking or peeling was observed after the temperature cycle test, and it is evident that it is thereby possible to maintain good sealed conditions. Whereas, in Ex. 19, the average thermal expansion coefficient of the glass used (glass in Ex. 17) was outside the range of the present invention, and cracking and peeling were observed after the temperature cycle test.

Further, in Ex. 18 wherein the difference in the average thermal expansion coefficient is small between the glass and the light emitting diode package made of the glass ceramic substrate composed of LTCC, the output margin of laser light is broad, whereby stable production is possible as adhesion failure is less likely to occur. In contrast, in Ex. 19 wherein the difference in the average thermal expansion coefficient was large between the glass and the light-emitting diode package made of the glass ceramic substrate composed of LTCC, the output margin of laser light was narrow, whereby adhesion failure was likely to occur due to output variations of the laser light.

INDUSTRIAL APPLICABILITY

According to the present invention, it is possible to provide a cover glass for light emitting diode package, a sealed structure and a light emitting device, capable of preventing deterioration of the transmittance characteristics during the use for a long period of time.

This application is a continuation of PCT Application No. PCT/JP2014/082305, filed on Dec. 5, 2014, which is based upon and claims the benefit of priority from Japanese Patent Application No. 2013-256170 filed on Dec. 11, 2013. The contents of those applications are incorporated herein by reference in their entireties.

REFERENCE SYMBOLS

1: light emitting device, 2: wavelength conversion member, 3: light emitting diode (light emitting diode chip), 4: cover glass for light emitting diode package, 5: light emitting diode package (glass ceramic substrate), 6: sealing material.

What is claimed is:

1. A cover glass, consisting essentially of, by mass % as calculated as oxides:
   from 55 to 80% of $SiO_2$;
   from 0.5 to 15% of $Al_2O_3$;
   from 5 to 25% of $B_2O_3$;

from 0 to 7% of $Li_2O$;
from 0 to 15% of $Na_2O$;
from 0 to 10% of $K_2O$, with the proviso that $Li_2O+Na_2O+K_2O$=from 2 to 20%;
from 0 to 2% $TiO_2$;
from 0 to 0.1% of $SnO_2$; and
from 0.001 to 0.1% of $Fe_2O_3$,
wherein the cover glass has an average thermal expansion coefficient of from 45 to $70\times10^{-7}$/° C. in a temperature range of from 0 to 300° C.

2. The cover glass according to claim 1, consisting essentially of, by mass % as calculated as oxides:
from 55 to 80% of $SiO_2$,
from 0.5 to 15% of $Al_2O_3$,
from 5 to 25% of $B_2O_3$,
from 0 to 7% of $Li_2O$,
from 0 to 15% of $Na_2O$,
from 0 to 10% of $K_2O$, with the proviso that $Li_2O+Na_2O+K_2O$=from 2 to 20%;
from 0 to 2% $TiO_2$;
from 0 to 0.1% of $SnO_2$; and
from 0.003 to 0.1% of $Fe_2O_3$,
wherein the cover glass has an average thermal expansion coefficient of from 45 to $70\times10^{-7}$/° C. in a temperature range of from 0 to 300° C.

3. The cover glass according to claim 1, wherein the transmittance at a wavelength of 365 nm in a thickness of 1 mm is at least 85%.

4. The cover glass according to claim 1, wherein the average transmittance at a wavelength of from 808 to 1,064 nm in a thickness of 1 mm is at least 85%.

5. The cover glass according to claim 1, wherein the refractive index (nd) is at most 1.52.

6. A sealed structure having a cover glass and a light emitting diode package bonded to each other, wherein a light emitting diode package and the cover glass according to claim 1 are bonded.

7. A sealed structure having a cover glass and a light emitting diode package bonded to each other, wherein the light emitting diode package comprises a glass ceramic substrate obtained by firing a glass ceramic composition comprising a glass powder and a ceramic filler, and the glass ceramic substrate and the cover glass according to claim 1 are bonded.

8. The sealed structure according to claim 6, wherein the cover glass is bonded to the light emitting diode package via a low melting point glass which is melted by laser irradiation.

9. A light emitting device, comprising a cover glass according to claim 1, a light emitting diode package having a light emitting diode mounted thereon, and a sealing material comprising a low melting point glass which is melted by laser irradiation to bond the cover glass and the light emitting diode package.

10. The light emitting device according to claim 9, wherein the sealing material comprises the low melting point glass and an inorganic filler.

11. The light emitting device according to claim 10, wherein the inorganic filler is at least one member selected from the group consisting of a low-expansion filler and an electromagnetic wave absorbing material.

12. The light emitting device according to claim 9, wherein the difference in average thermal expansion coefficient in a temperature range of from 25 to 300° C. between the light emitting diode package and the cover glass is at most $20\times10^{-7}$/° C.

13. The light emitting device according to claim 9, wherein the light emitting diode package comprises a glass ceramic substrate obtained by firing a glass ceramic composition comprising a glass powder and a ceramic filler, and between the average thermal expansion coefficient in a temperature range of from 25 to 300° C. of the glass ceramic substrate and the average thermal expansion coefficient in a temperature range of from 25 to 300° C. of the cover glass, there is a relation of "the average thermal expansion coefficient of the glass ceramic substrate"≥"the average thermal expansion coefficient of the cover glass".

14. The cover glass according to claim 1, wherein the amount of $SnO_2$ is from 0 to 0.002%.

* * * * *